United States Patent [19]
Imamura

[11] Patent Number: 5,587,679
[45] Date of Patent: Dec. 24, 1996

[54] PULSE GENERATOR INCLUDING SLEW RATE CONTROLLER WITHOUT COMPLEMENTARY TRANSISTORS

[75] Inventor: Makoto Imamura, Tokyo, Japan

[73] Assignee: Yokogawa Electric Corporation, Tokyo, Japan

[21] Appl. No.: 436,693

[22] Filed: May 8, 1995

[51] Int. Cl.$^6$ ..................................... H03K 5/12
[52] U.S. Cl. ............................ 327/170; 327/65; 327/374; 327/563
[58] Field of Search ..................................... 327/172, 170, 327/374, 375, 376, 377, 108, 65, 66, 67, 333, 563; 326/17, 18, 29; 330/252

[56] References Cited

U.S. PATENT DOCUMENTS

| | | | |
|---|---|---|---|
| 3,263,223 | 7/1966 | Zenzefilis | 327/170 |
| 3,573,502 | 4/1971 | Kan | 327/170 |
| 4,511,853 | 4/1985 | Matthies et al. | 330/259 |
| 4,810,908 | 3/1989 | Suzuki et al. | 327/333 |
| 4,891,604 | 1/1990 | Cotreau | 330/252 |
| 5,039,952 | 8/1991 | Dreps et al. | 330/252 |
| 5,134,309 | 7/1992 | Matsumoto et al. | 327/563 |
| 5,138,204 | 8/1992 | Imamura et al. | 327/172 |
| 5,185,581 | 2/1993 | Brown | 330/254 |
| 5,192,876 | 3/1993 | Karube | 327/170 |
| 5,345,346 | 9/1994 | Brannon et al. | 360/67 |
| 5,355,094 | 10/1994 | Soda | 327/65 |
| 5,379,457 | 1/1995 | Nguyen | 455/323 |

FOREIGN PATENT DOCUMENTS

5137716  10/1980  Japan ..................................... 327/113

*Primary Examiner*—Timothy P. Callahan
*Assistant Examiner*—Kenneth B. Wells
*Attorney, Agent, or Firm*—Moonray Kojima

[57] ABSTRACT

A pulse generator using a buffer for receiving a differential signal and for generating an output signal in response thereto; a first differential amplifier for receiving the output signal from the buffer; and a pair of capacitors connected to the first differential amplifier and being caused to be charged by the buffer for selectively controlling the first differential amplifier; and means for receiving another differential signal from the first differential amplifier to produce a pulse, whereby a slew rate controller is used without requirement of complementary transistors to produce the pulse.

12 Claims, 5 Drawing Sheets

PULSE GENERATOR INCLUDING SLEW RATE CONTROLLER WITHOUT COMPLEMENTARY TRANSISTORS

BACKGROUND OF THE INVENTION

1. Field of Invention

This invention relates to a pulse generator, such as used in an LSI tester; and, more particularly, to a pulse generator having a slew rate controller.

2. Description of Prior Art

In the conventional pulse generator, upon receipt of differential signals inputted from differential signal sources, differential amplifiers produce pulse signals of desired levels, and the slew rate of the signal is controlled by a slew rate controller provided at an output stage of the differential amplifier.

Figure 1:
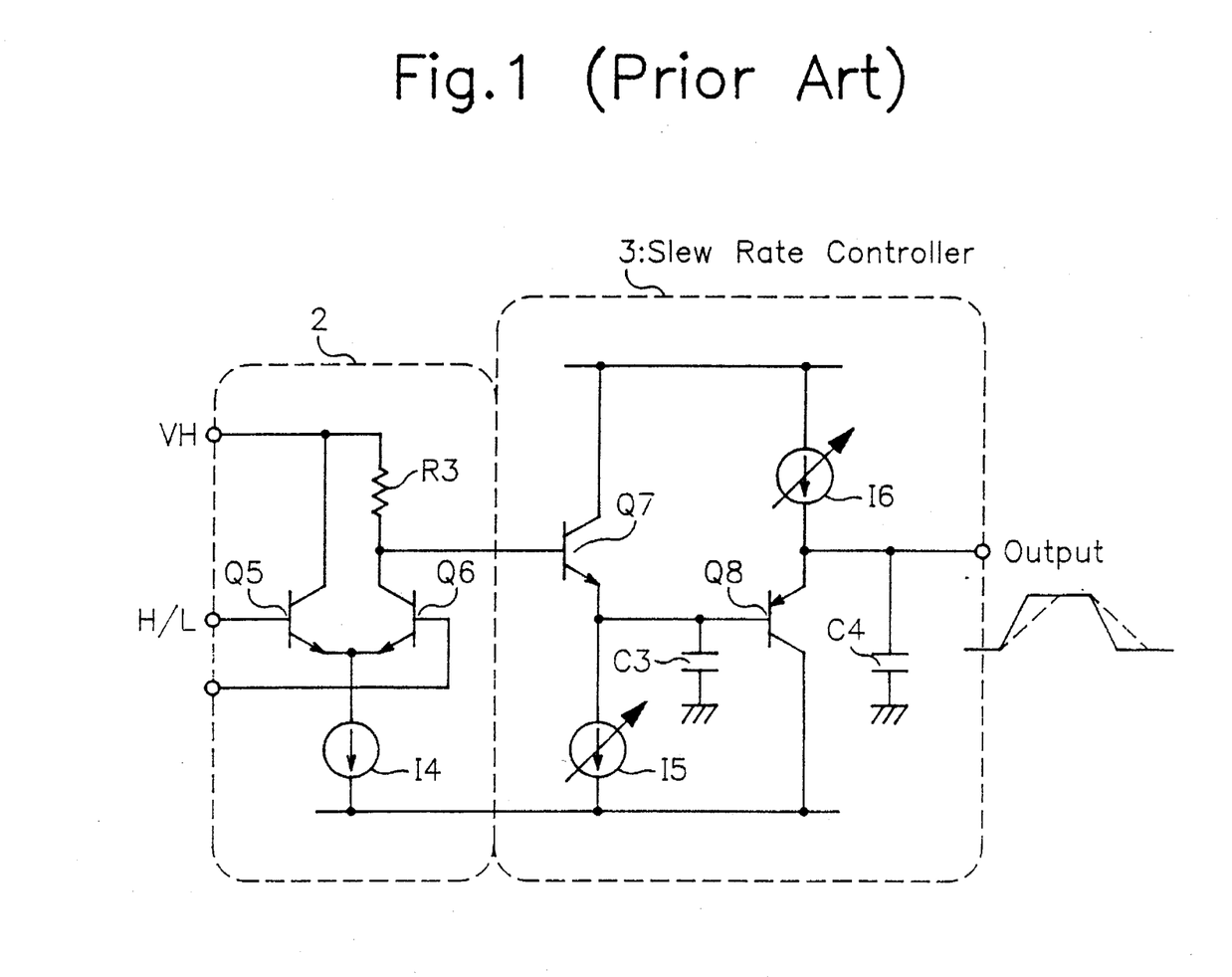
FIG. 1 is a circuit diagram depicting a conventional pulse generator.

FIG. 1 shows an exemplary conventional pulse generator, wherein differential amplifier 2 outputs a pulse signal, of a desired level, upon receipt of a differential signal. Differential amplifier 2 comprises NPN transistors Q5, Q6, current source I4, and resistor R3. A slew rate controller 3 is provided which outputs pulse signals such that the rising time and falling time of the signal outputted from differential amplifier 2 are limited. Slew rate controller 3 comprises NPN transistor Q7, PNP transistor Q8, current sources I5, I6, and capacitors C3, C4.

The operation of the conventional pulse generator will now be described with reference first to the operation of the differential amplifier 2, and then the operation of the slew rate controller 3.

Operation of Differential Amplifier

When the differential signal (see H/L) is at a high level, NPN transistor Q5 is turned ON, and NPN transistor Q6 is turned OFF, so that no current flows through resistor R3. Voltage VH is outputted from amplifier 2. Conversely, when the differential signal is at a low level (L), NPN transistor Q5 is turned OFF, and NPN transistor Q6 is turned ON, so that current Id of current source I4 flows through resistor R3. In other words, the voltage drop across resistor R3, caused by the change in collector current, becomes the amplitude of the pulse signal. Then, the high level of the pulse signal becomes "VH" and the low level of the pulse signal becomes "VH−Rc×Id", wherein Rc indicates the resistance value of resistor R3.

Operation of Slew Rate Controller

When the pulse signal, derived from differential amplifier 2, is raised, current flows between the collector of NPN transistor Q7 and the emitter thereof, so that capacitor C3 is charged. At this time, no current flows through the collector of transistor Q8 and the emitter thereof, and capacitor C4 is charged by current supplied from source I6. As a result, the rising time of the output signal from slew rate controller 2 is delayed from the rising time of the pulse signal outputted from amplifier 2.

Thus, when the pulse signal outputted from amplifier 2 falls, no current flows between the collector and emitter of transistor Q7, and current flows from capacitor C3 to source I5, so that capacitor C3 is discharged. At this time, current flows between the collector and emitter of transistor Q7, and current flows from capacitor C4 to transistor Q8, so that capacitor C4 is discharged. Hence, the falling time of the output signal from slew rate controller 3 is delayed from the falling time of the pulse signal outputted from amplifier 2.

Under such conditions, the slew rate can be controlled by controlling the amount of current supplied by sources I5 and I6.

However, there is a problem encountered by prior art devices in that the slew rate controller must have complementary transistors.

SUMMARY OF THE INVENTION

An object of the invention is to overcome the aforementioned and other deficiencies, disadvantages, and problems of the prior art.

Another object is to provide a pulse generator having a slew rate controller without using complementary transistors.

The foregoing and other objects are attained in one aspect of the invention which encompasses a pulse generating apparatus for generating a pulse in response to a differential signal, comprising a drive circuit for receiving a differential signal, a first differential amplifier for receiving an output from the drive circuit, a first capacitor, provided between a positive input terminal of the first differential amplifier and a negative output terminal thereof, and being charged by the drive circuit in response to the differential signal, and a second capacitor, provided between a negative input terminal of the first differential amplifier, and a positive output terminal thereof in response to the differential signal, whereby the signal received by the first differential amplifier is used as the differential signal to produce the pulse.

In another aspect of the invention, there is provided a pulse generating apparatus for generating a pulse upon receipt of a pair of differential signals, wherein one of the differential signals is at a high level and the other is at a low level, and comprising a drive circuit comprising a first NPN transistor, and a second NPN transistor, the emitters thereof being connected to a first current source and a second current source, and the collectors thereof being connected in common, a first differential amplifier comprising a third NPN transistor and a fourth NPN transistor, the emitters thereof being connected to a third current source, and the bases thereof being connected to the emitters of the first and second NPN transistors, respectively, a first capacitor provided between the collector and base of the third NPN transistor, a second capacitor provided between the collector and base of the fourth NPN transistor, and a second differential amplifier comprising a fifth NPN transistor and a sixth NPN transistor, the emitters thereof being connected to a fourth current source, and the bases thereof being connected to the bases of the third and fourth NPN transistors, whereby a pulse is generated at one of the collectors of the fifth and sixth transistors.

DETAILED DESCRIPTION OF THE PREFERRED EMBODIMENTS

Figure 2:
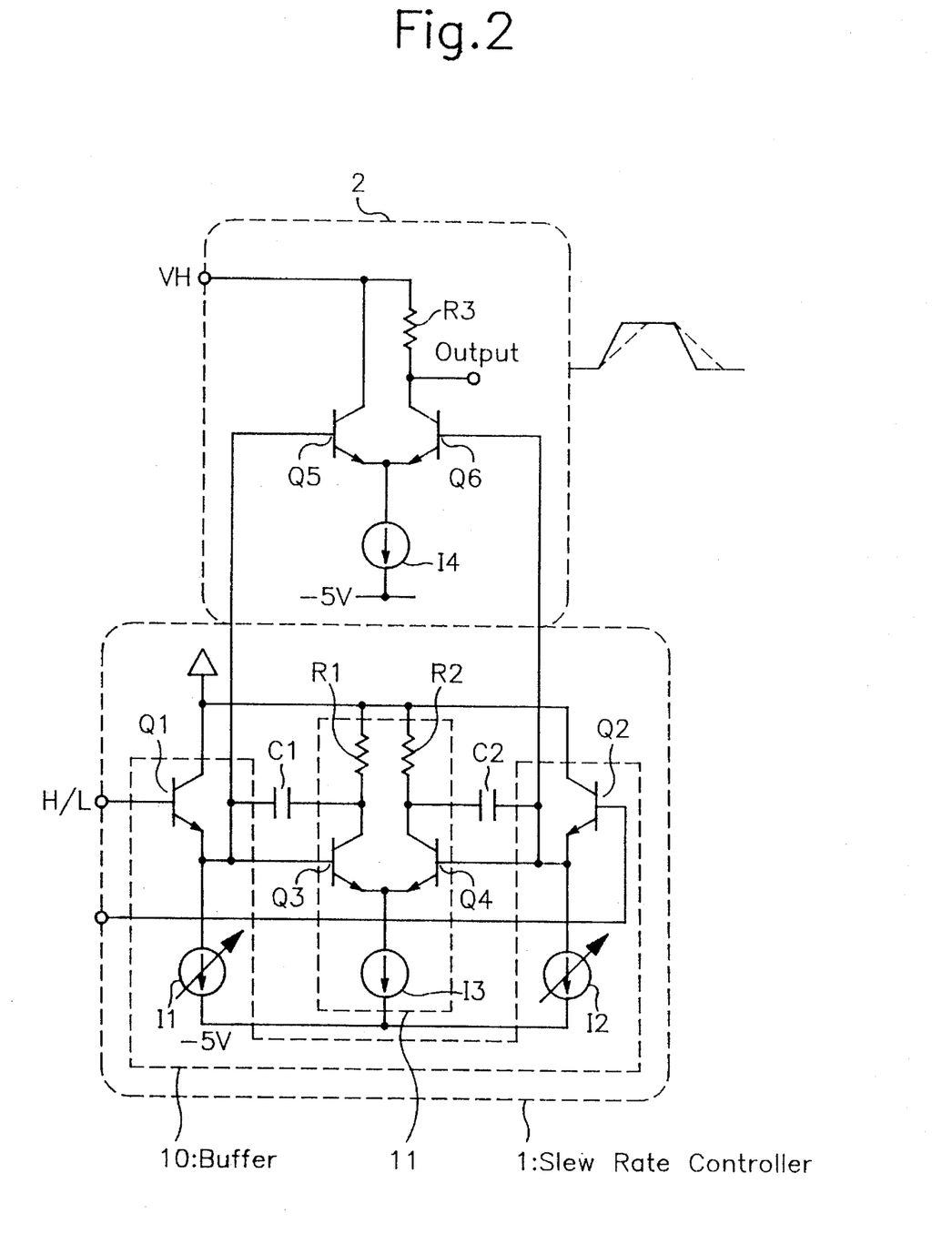
FIG. 2 is a circuit diagram depicting an illustrative embodiment of the invention.

FIG. 2 shows a slew rate controller 1 and a differential amplifier 2. A differential signal (e.g. labeled H/L) is inputted to controller 1 which then outputs such a differential signal, whose slew rate has been controlled, to an input terminal of differential amplifier 2. Upon receipt of the differential signal, amplifier 2 generates a pulse (see illustrated pulse).

In controller 1, a differential signal is applied to a buffer 10, which is connected to differential amplifier 11. Then, a signal applied to differential amplifier 11 is outputted as a differential signal to differential amplifier 2. A first capacitor C1 is provided between a positive input terminal of differential amplifier 11 and a negative output terminal thereof. A second capacitor C2 is provided between a negative input terminal and a positive output terminal of amplifier 11.

Buffer 10 comprises a first current source I1 and a second current source I2 which have first ends thereof connected to a −5 V voltage line and control the current level. An NPN transistor Q1 is a first emitter follower and has an emitter connected to the other terminal end of first current source I1. Another NPN transistor Q2, which is a second emitter follower, has its emitter connected to the other terminal end of second current source I2. The collectors of NPN transistors Q1 and Q2 are grounded.

In differential amplifier 11, the bases of NPN transistors Q3 and Q4 are used as the positive input terminal and the negative input terminal, respectively. To the bases of NPN transistors Q3 and Q4, the emitters of transistors Q1 and Q2 are connected. A first terminal of another current source I3 is connected to the emitters of transistors Q3 and Q4 and a first end of resistors R1 and R2 is connected to the collector of transistors Q3 and Q4, respectively. The collectors of transistors Q3 and Q4 constitute the negative output terminal and the positive output terminal, respectively. The other terminal of current source I3 is connected to the −5 V voltage line, and the other terminals of resistors R1 and R2 are grounded.

In differential amplifier 2, the bases of NPN transistors Q3 and Q4 are connected to the bases of NPN transistors Q5 and Q6. A first end of another current source I4 is connected to the emitters of NPN transistors Q5 and Q6. The other end of current source I4 is connected to the −5 V voltage line. The collector of NPN transistor Q5 is connected to a line carrying a voltage having value VH. The collector of NPN transistor Q6 is connected to a first end of resistor R3. The other end of resistor R3 is connected to the line carrying voltage of value VH. The output signal at the collector of transistor Q6 is outputted as a pulse.

Figure 3:
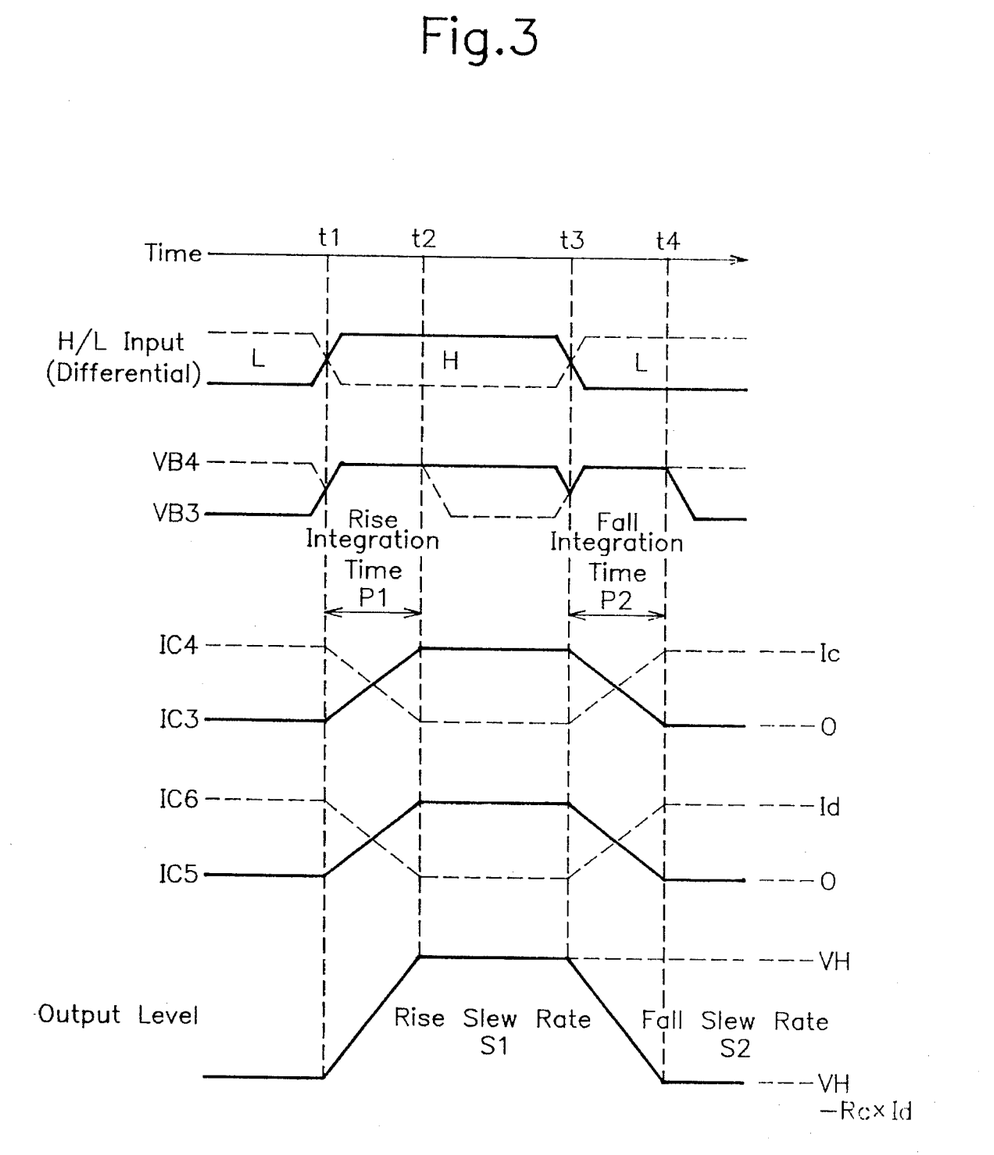
FIG. 3 is a timing chart useful in describing operation of the embodiment of FIG. 2.

The operation of the FIG. 2 embodiment will now be described with reference to the timing chart of FIG. 3, with the operation of the slew rate controller being described first, followed by description of the operation of the differential amplifier.
Operation of Slew Rate Controller.

It is assumed that the differential signal is at a low level (e.g. −1.8 V) as an initial condition. At this time, the emitter of transistor Q1 is at a low level, whereas the emitter of transistor Q2 is at a high level. Thus, the relationship between the base voltage VB3 of transistor Q3 and the base voltage VB4 of transistor Q4 is VB3<VB4. That is to say, transistor Q3 is brought into an OFF state, and transistor Q4 is brought into an ON state. As a result, the entire current Ic, of current source I3, flows through the emitter and collector of transistor Q4.

At a time instant t1, it is assumed that the level of the differential signal changes from the low level to the high level (e.g. −0.9 V).

At the cross-over point (time instant t1) of the differential inputs, the base voltage VB3 of transistor Q3 is coincident with the base voltage VB4 of transistor Q4. Then, both transistors Q3 and Q4 enter into the active regions wherein the transistors function as a differential amplifier. As a result, both VB3 and VB4 become high level potentials due to the feedback effect of capacitor C2. Thus, the active condition is maintained. As a result, transistor Q1 is in an ON state, which causes current Ia from source I1 to flow as the emitter current of transistor Q1. Transistor Q2 is reverse biased to an OFF state. Thus, the entire current Ib from source I2 flows through capacitor C2 to charge capacitor C2.

As a result, the collector voltage of transistor Q4 is increased, in a ramp form, in accordance with the charging operation of capacitor C2. At the same time, collector current IC4 of transistor Q4 is decreased, in a ramp form. Thereafter, when IC4=0, the charging operation is completed, and the operation of transistors Q3 and Q4 is released from the active region, so that voltage VB4 is lowered toward the low level.

Transistor Q3 performs differential amplification in combination with transistor Q4. As a result, collector current IC3 of transistor Q3 is governed by the relationship IC3=Ic−IC4.

Assuming that the time instant when the charging operation of capacitor C2 is completed is recognized as t2, then, the charging time P1, defined as being from time t1 to time t2, may be expressed by the following equation:

$$P1=Cb*\Delta V/Ib \qquad (1)$$

wherein Cb indicates the capacitance of capacitor C2, and ΔV represents the change in terminal voltage of capacitor C2 from time instant t1 to time t2, and is expressed by the following:

$$\Delta V=(Ic-Ib)*Rb \qquad (2)$$

When equation (2) is substituted in equation (1), the following results:

$$P1=(Ic-Ib)*Cb*Rb/Ib \qquad (3)$$

It should be understood that equation (3) represents precise conditions. Accordingly, since current Ib is sufficiently lower than current Ic in most cases, equation (3) may be approximated as follows:

$$P1=Ic*Cb*Rb/Ib \qquad (4)$$

Similarly, it is assumed that the transition from the high level to the low level occurs in the differential signal at a time instant t3. At the cross over point, i.e. time instant t3, of the differential inputs, base voltage VB3 of transistor Q3 is coincident with the base voltage VB4 of transistor Q4. Then, transistors Q3 and Q4 enter the active region where the two transistors function as a differential amplifier. As a result, both base voltages VB3 and VB4 become high level voltages due to the feed back operation of capacitor C1, so that the active region is maintained. Accordingly, transistor Q2 is in an ON state, which causes current Ib from current source I2 to flow as the emitter current of transistor Q2. Then, transistor Q1 is reverse biased, so that transistor Q1 is brought into an OFF state, and the entire current Ia from source I1 flows through capacitor C1, thereby charging capacitor C1.

As a result, the collector voltage of transistor Q3 is increased, in a ramp form, in accordance with the charging operation of capacitor C1. At the same time, collector current IC3 of transistor Q3 is decreased, in a ramp form. Thereafter, when IC3=0, the charging operation is completed, and the operation of transistors Q3 and Q4 is released from the active region, so that base voltages VB3 of transistor Q3 is lowered toward the low level.

Transistor Q4 performs the differential amplification in combination with transistor Q3. As a result, collector current IC4 of transistor Q4 is governed by the relationship IC4=Ic–IC3. When capacitor C1 is charged, current flows from capacitor C2 to transistor Q4. As a result, capacitor C2 is discharged.

Assuming that the time instant when the charging operation of capacitor C1 is completed is t4, then, charging time P2, which is defined to be between time t3 and time t4, is express as follows:

$$P2=Ca*\Delta V'/Ia \quad (5)$$

wherein Ca is the capacitance of capacitor C1; $\Delta V'$ is the change in terminal voltage of capacitor C1 from t3 to t4, and is expressed as follows:

$$\Delta V'=(Ic-Ia)*Ra \quad (6)$$

wherein Ra is the resistance value of resistor R1.

When equation (6) is substituted in equation (50, the following results:

$$P2=(Ic-Ia)*Ca*Ra/Ia \quad (7)$$

Equation (7) reflects precise conditions. Accordingly, since current Ia is sufficiently lower than current Ic in most cases, equation (7) may be approximated as follows:

$$P2 \approx Ic*Ca*Ra/Ia \quad (8)$$

Operation of Differential Amplifier

The differential amplifier 2 operates as follows. Since the bases of transistors Q5 and Q6 are connected to the bases of transistors Q3 and Q4, respectively, the collector currents are governed by the following:

$$IC6/IC5=IC4/IC3 \quad (9)$$

wherein IC5 and IC6 denote the collector currents of transistors Q5 and Q6. Equation (9) shows that the collector currents of transistors Q5 and Q6 become analogous to those of transistors Q3 and Q4. In other words, the signal waveform outputted from differential amplifier 2 becomes a voltage which is analogous to collector current IC4 of transistor Q4. Thus, the slew rate of the signal outputted from differential amplifier 2 is selectively controlled. The rise slew rate S1 and the fall slew rate S2 are defined as follows:

$$S1=Id*Rc/P1 \quad (10)$$

$$S2=Id*Rc/P2 \quad (11)$$

wherein Id represents the current value from source I4, and Rc represents the resistance value of resistor R3.

When equations (10) and (11) are substituted into equations (4) and (8), respectively, the following result:

$$S1=(Id*Rc)/(Ic*Rb*Cb)*Ib \quad (12)$$

$$S2=(Id*Rc)/(Ic*Ra*Ca)*Ia \quad (13)$$

As is apparent from equations (12) and (13), the rise slew rate S1 of the signal outputted from differential amplifier 2 may be determined by current Ib of current source I2, and the fall slew rate S2 may be determined by current Ia of current source I1. In other words, when the currents derived from current sources I1 and I2 are selectively controlled, the slew rates can be selectively controlled.

As described above, the slew rate controller 1 is constructed without the use of complementary transistors. When the slew rate controller 1 comprises NPN transistors, a pulse having a better waveform quality is produced at high speed. That is, with the invention, it is possible to solve waveform quality problems when either the rising time of a PNP transistor, or the falling time thereof, are prolonged and overshoot occurs.

In manufacturing integrated circuits, when high speed PNP transistors are used in the waveform generating unit, processing cost is increased. In contrast, in the invention, when the waveform generating unit is constructed by using only NPN transistors, the total cost of the waveform generating unit is reduced because complementary processing is not required.

Although the pulse generator of the invention is arranged to output the pulse from the collector of the NPN transistor Q6, the invention is not limited thereto. For example, the pulse generator may be constructed in such a manner that the pulse is outputted from the collector of NPN transistor Q5. In this case, a resistor is provided between the collector of NPN transistor Q5 and the line carrying voltage of value VH. The polarity of this pulse is reversed with respect to that of the pulse outputted from NPN transistor Q6. Also, although the pulse generator is described as using NPN transistors, other arrangements can be used, such as use of GaAs field effect transistors.

Figure 4:
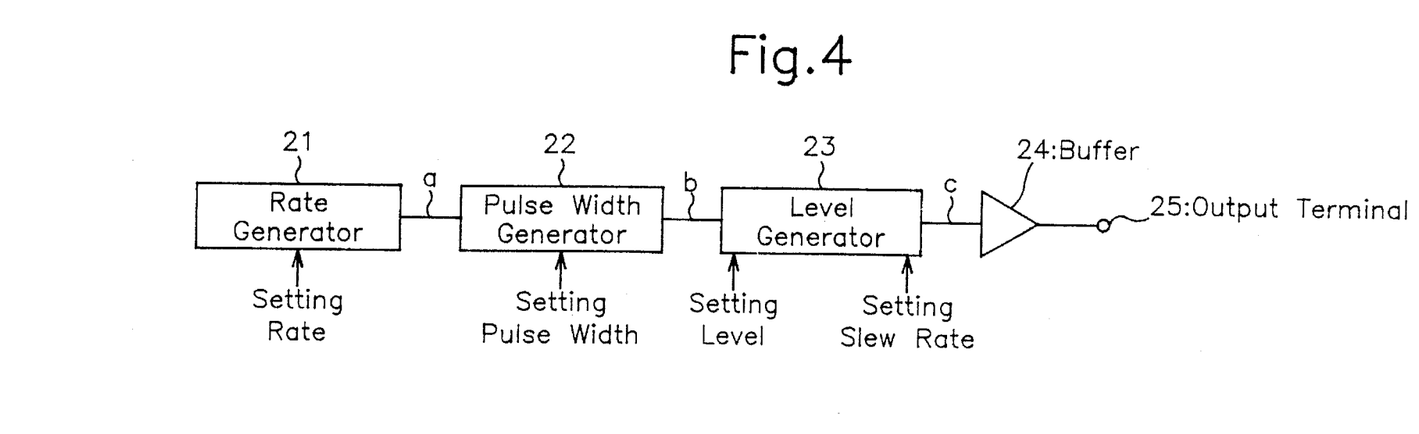
FIG. 4 is a block diagram depicting another illustrative embodiment of the invention, wherein the embodiment of FIG. 2 is used in an exemplary application.

FIG. 4 shows an exemplary application of the embodiment of FIG. 2, wherein a rate generator 21 outputs a rate signal a based on the rate setting condition. A pulse width generator 22 receives the rate signal a from rate generator 21, and outputs a pulse width signal b based upon pulse width setting condition. A level generator 23 receives pulse width signal b derived from pulse generator 22 and then outputs a pulse signal c based upon both the level setting condition and the slew rate setting condition. A buffer 24 receives a pulse signal c and outputs pulse signal c at an output terminal thereof.

Level generator 23 corresponds to the pulse generator of FIG. 2 and receives pulse signal b as a differential signal. The level setting of pulse signal c is performed by controlling voltage value VH and the current from current source I4 of FIG. 2. In other words, the high level of pulse signal c is determined by varying voltage value VH. The low level of pulse signal c is determined by varying the current from current source I4.

Figure 5:
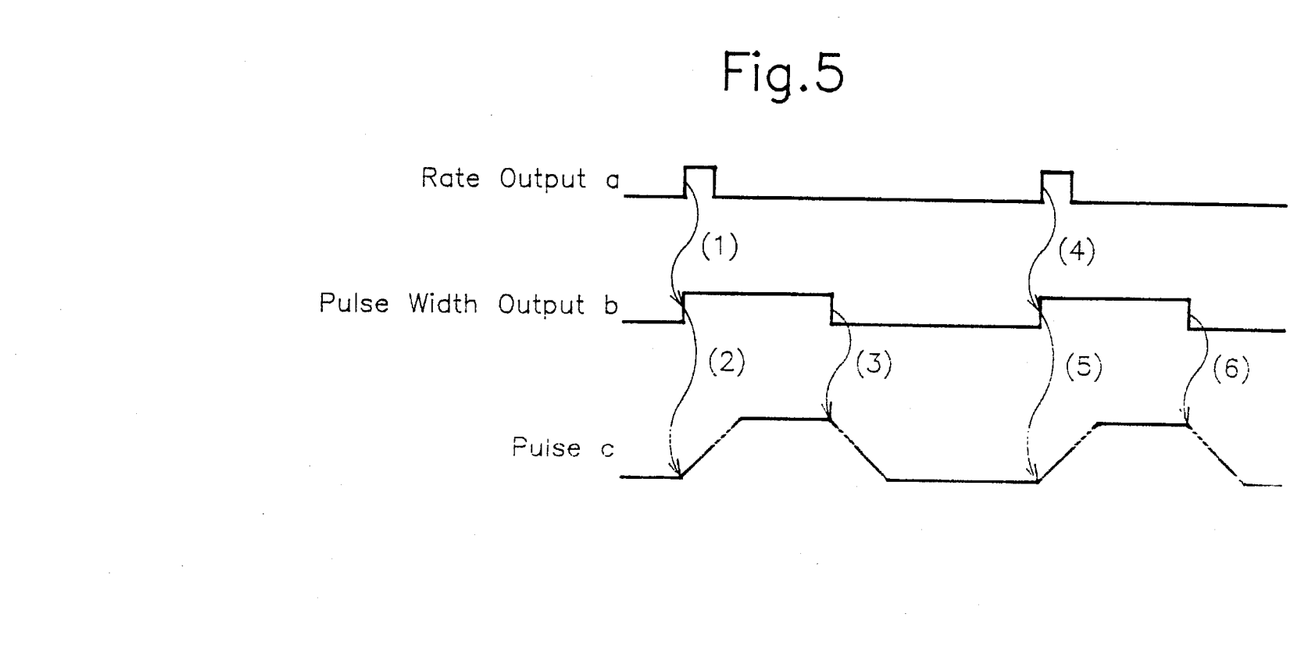
FIG. 5 is a timing chart useful for describing the operation of the embodiment of FIG. 4.

Operation of the FIG. 4 embodiment will now be described with reference to FIG.5, which has numerals (1)–(6) added to clarify the description. Rate generator 21 outputs a pulse as rate signal a. (1) The pulse width generator 22 causes pulse width signal b to be raised in response to the rising portion of rate signal a supplied from rate generator 21. (2) Pulse signal c outputted from level generator 23 starts to be increased, in a ramp form, in response to the rising portion of pulse width signal b. Then, the slope is determined by the slew rate setting operation. The level of pulse signal c is increased up to a high level set by the level setting operation. (3) After a time period has elapsed, which was set by the pulse width setting operation after the rising time, pulse width signal b is caused to fall, so that pulse signal c starts to be lowered in a ramp form. Then, pulse signal c is reduced to a low level set by the level setting operation.

After the time period set by the rate setting operation and after rate generator 21 previously outputted the pulse, another pulse is outputted as rate signal a. (4) Then, pulse width generator 22 causes the pulse signal to be raised in response to the raising portion of rate signal a derived from rate generator 21. (5) Pulse signal c, outputted from level generator 23, starts to be increased, in ramp form, in response to the rising portion of pulse width signal b. Pulse signal c is increased up to a high level set by the level setting operation. (6) Pulse width signal b is caused to fall after a time period, defined by the pulse width setting condition from the raising operation, has passed, so that pulse signal c starts to be lowered, in ramp form. Then, pulse signal c is lowered to a low level set by the level setting operation. In the foregoing manner, a pulse signal is outputted whose rate, pulse width, level, and slew rate setting are arbitrarily set.

Figure 6:
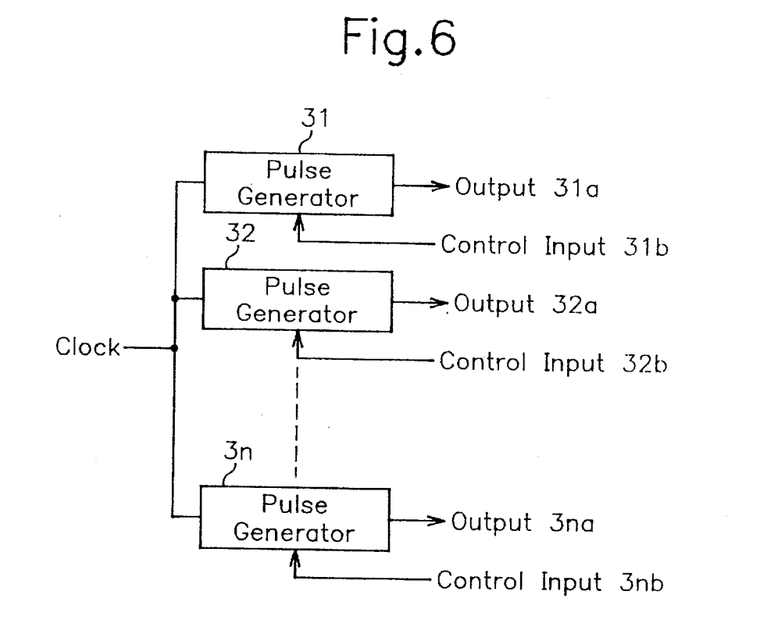
FIG. 6 is a block diagram depicting a further illustrative embodiment of the invention, wherein the embodiment of FIG. 2 is used in another exemplary application.

FIG. 6 shows another illustrative application of the embodiment of FIG. 2, wherein a plurality of pulse generators of FIG. 2 are used. In FIG. 6, upon receipt of a clock, pulse generators 31 to 3n distribute the same clock to a plurality of circuits (not shown) as outputs 31a to 3na. Then, in response to control signals 31b to 3nb, pulse generators e1 to 3n control the slew rate of the respective output signals 31a to 3na. Each of the pulse generators 31 to 3n correspond to the pulse generator of FIG. 2.

Figure 7:
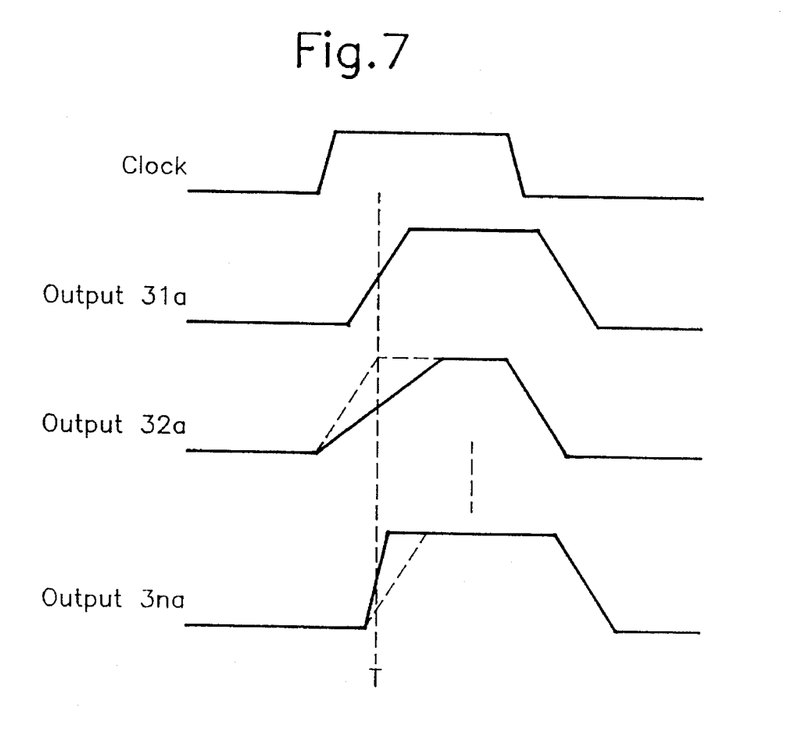
FIG. 7 is a timing chart useful in describing operation of the embodiment of FIG. 6.

The operation of the embodiment of FIG. 6 will be described with reference to the timing chart of FIG. 7, wherein the conditions of outputs 32a and 3na, whose slew rates have not yet been controlled are indicated by the broken line. There is a small fluctuation in the output timings of the multiple signals due to non-uniform characteristics of the components and also due to differences in the lengths of the wires used therein. This embodiment is provided to control the fluctuations just mentioned.

Upon receipt of the clock, pulse generators 31 to 3n output the outputs 31a to 3na. Then, at a time instant T, the rising slew rates of outputs 32a to 3na are controlled in order to be synchronized with output 31a. In FIG. 7, the current from current source I2 is lowered from the condition of output signal 32a indicated by the broken line, thereby making the rising slew rate small, and so that the condition indicated by the solid line is obtained. Also, the current from current source I2 of FIG. 2 is increased from the condition of output 3na, indicated by the broken line, thereby increasing the rising slew rate to achieve the condition indicated by the solid line.

As described, even when the same clock is inputted, the timing errors of the pulse signal, generated by the pulse generator, can be minimized by controlling the slew rate of the pulse signals, and so that the skew among the pulse signals is removed.

The foregoing is illustrative of the principles of the invention. Numerous modifications and extensions thereof would be apparent to the worker skilled in the art. All such modifications and extensions are to be considered to be within the spirit and scope of the invention.

What is claimed is:

1. A pulse generator for generating a pulse, comprising:

buffer means for receiving a differential signal and for producing an output signal, said buffer means comprising a pair of selectively controllable current sources;

a first differential amplifier for receiving said output signal from said buffer means and for producing another differential signal, said first differential amplifier comprising a positive input terminal, a negative input terminal, a positive output terminal, and a negative output terminal;

a first capacitor connected between said positive input terminal and said negative output terminal of said first differential amplifier, and being caused to be charged by said buffer means and selectively controlling said first differential amplifier;

a second capacitor connected between said negative input terminal and said positive output terminal of said first differential amplifier, and being caused to be charged by said buffer means and selectively controlling said first differential amplifier;

wherein said another differential signal is obtained at connections of said first and second capacitors and said positive and negative input terminals of said first differential amplifier; and means for receiving said another differential signal and in response thereto for producing said pulse, whereby a rising slew rate of said pulse is selectively controlled by one of said pair of current sources of said buffer means and a falling slew rate of said pulse is selectively controlled by the other of said pair of current sources of said buffer means without the use of complementary transistors.

2. The generator of claim 1, wherein said buffer means comprises a transistor, and wherein said first differential amplifier comprises an NPN transistor.

3. The generator of claim 1, wherein said buffer means comprises a transistor, and wherein said first differential amplifier comprises a field effect transistor.

4. The generator of claim 3, wherein said field effect transistor comprises GaAs.

5. The generator of claim 1, wherein said means for receiving comprises a second differential amplifier, and wherein said another differential signal produced by said first differential amplifier is supplied to said second differential amplifier, and wherein said second differential amplifier produces said pulse.

6. The generator of claim 1, further comprising:

a rate generating unit for generating a rate signal; and a pulse width generating unit for receiving said rate signal and for producing a pulse width signal, whereby said pulse width signal is supplied to said means for receiving.

7. The generator of claim 1, further comprising a plurality of pulse generators, and means for controlling the slew rates of pulses produced by said plurality of pulse generators so that said pulses are synchronized with each other.

8. A pulse generator for generating a pulse upon receipt of a pair of differential signals wherein one of said pair of differential signals is at a first level, and the other of said pair of differential signals is at a second and lower level, said pulse generator comprising:

buffer means comprising a first NPN transistor and a second NPN transistor, having emitters thereof connected to a first current source and a second current source, respectively, and having collectors thereof commonly connected;

a first differential amplifier comprising a third NPN transistor and a fourth NPN transistor, having emitters thereof connected to a third current source, and having bases thereof connected to said emitters of said first and second NPN transistors, respectively;

a first capacitor connected between a collector of said third NPN transistor and said base thereof;

a second capacitor connected between a collector of said fourth NPN transistor and said base thereof; and a second differential amplifier comprising a fifth NPN transistor and a sixth NPN transistor, having emitters thereof connected to a fourth current source, and having bases thereof connected to said bases of said third and fourth NPN transistors, respectively, whereby said pulse is generated at one of said collectors of said fifth and sixth NPN transistors.

9. The generator of claim 8, further comprising means for controlling current from at least one of said first and second current sources thereby to control a slew rate of said pulse.

10. The generator of claim 8, further comprising means for controlling said second differential amplifier thereby to control the voltage level of said pulse.

11. The generator of claim 8, further comprising a rate generating unit for generating a rate signal;

a pulse width generating unit for receiving said rate signal and for producing a pulse width signal; and means for applying said pulse width signal to said second differential amplifier to thereby produce said pulse.

12. The generator of claim 8, further comprising a plurality of pulse generators, and means for controlling slew rates of pulses outputted by said plurality of pulse generators to be synchronized with each other.

* * * * *